US008441050B2

(12) United States Patent
Luo et al.

(10) Patent No.: US 8,441,050 B2
(45) Date of Patent: May 14, 2013

(54) FIN TRANSISTOR STRUCTURE AND METHOD OF FABRICATING THE SAME

(75) Inventors: Zhijiong Luo, Poughkeepsie, NY (US); Huilong Zhu, Poughkeepsie, NY (US); Haizhou Yin, Poughkeepsie, NY (US)

(73) Assignee: Institute of Microelectronics, Chinese Academy of Sciences, Beijing (CN)

( * ) Notice: Subject to any disclaimer, the term of this patent is extended or adjusted under 35 U.S.C. 154(b) by 75 days.

(21) Appl. No.: 13/077,858

(22) Filed: Mar. 31, 2011

(65) Prior Publication Data
US 2011/0198676 A1 Aug. 18, 2011

Related U.S. Application Data

(63) Continuation-in-part of application No. PCT/CN2010/001447, filed on Sep. 20, 2010.

(30) Foreign Application Priority Data

Feb. 12, 2010 (CN) .......................... 2010 1 0112521

(51) Int. Cl.
*H01L 29/76* (2006.01)
*H01L 27/12* (2006.01)
*H01L 21/336* (2006.01)

(52) U.S. Cl.
USPC ............ 257/288; 257/347; 438/197; 438/300

(58) Field of Classification Search ........... 257/E21.442; 438/197, 300
See application file for complete search history.

(56) References Cited

U.S. PATENT DOCUMENTS

| 7,247,896 B2 * | 7/2007 | Oh et al. ........................ 257/288 |
| 2005/0282345 A1 * | 12/2005 | Mathew et al. ............... 438/301 |
| 2007/0090443 A1 * | 4/2007 | Choi et al. .................... 257/314 |
| 2007/0267668 A1 * | 11/2007 | Fischer ......................... 257/296 |
| 2007/0278572 A1 * | 12/2007 | Ban et al. ....................... 257/341 |
| 2007/0287255 A1 | 12/2007 | Doyle et al. |
| 2008/0001187 A1 * | 1/2008 | Booth et al. ................... 257/288 |
| 2009/0095980 A1 * | 4/2009 | Yu et al. ......................... 257/190 |

FOREIGN PATENT DOCUMENTS

CN 101097956 A 1/2008

OTHER PUBLICATIONS

Abstract of CN1542965A.
Abstract of CN101303975A.
Office Action of Jan. 11, 2012 for Chinese Application No. 201010112521.8 (with English translation).
International Search Report of PCT/CN2010/001447, filed on Sep. 20, 2010.

(Continued)

*Primary Examiner* — Long Tran
*Assistant Examiner* — Dzung Tran
(74) *Attorney, Agent, or Firm* — Knobbe, Martens, Olson & Bear LLP

(57) ABSTRACT

A fin transistor structure and a method of fabricating the same are disclosed. In one aspect the method comprises providing a bulk semiconductor substrate, patterning the semiconductor substrate to form a fin with it body directly tied to the semiconductor substrate, patterning the fin so that gaps are formed on the bottom of the fin at source/drain regions of the transistor structure to be formed. This is performed wherein a portion of the fin corresponding to the channel region of the transistor structure to be formed is directly tied to the semiconductor substrate, while other portions of the fin at the source/drain regions are separated from the surface of the semiconductor substrate by the gaps. Also, filling an insulation material into the gaps, and fabricating the transistor structure based on the semiconductor substrate with the fin formed thereon are disclosed. Thereby, it is possible to reduce the leakage current while maintaining the advantages of body-tied structures.

13 Claims, 19 Drawing Sheets

(a)

(b)

OTHER PUBLICATIONS

Okano et al., "Process Integration Technology and Device Characteristics of CMOS FinFET on Bulk Silicon Substrate with sub-10 nm Fin Width and 20 nm Gate Length", Electron Devices Meeting, 2005. IEDM Technical Digest. IEEE International, Dec. 2005.

Park et al., "Body-tied triple-gate NMOSFET fabrication using bulk Si wafer", Solid-State Electronics 49 (2005) pp. 377-383.

Office Action of Aug. 3, 2012 for Chinese Application No. 201010112521.8, with English translation.

* cited by examiner (a)

(b)

(a)

(b)

(a)

(b)

(a)

(b)

(a)

(b)

(a)

(b)

(a)

(b)

(a)

(b)

(c)

(a)

(b)

(c)

(a)

(b)

(c)

(a)

(b)

(c)

(a)

(b)

(c)

(a)

(b)

(c)

(a)

(b)

(c)

(a)

(b)

(c)

(a)

(b)

(c)

(a)

(b)

(c)

(d)

FIN TRANSISTOR STRUCTURE AND METHOD OF FABRICATING THE SAME

CROSS-REFERENCE TO RELATED APPLICATIONS

This application is a continuation-in-part of International Application No. PCT/CN2010/001447, filed Sep. 20, 2010, which claims priority to Chinese Patent Application No. 201010112521.8, filed Feb. 12, 2010, each of which is hereby incorporated by reference in its entirety.

BACKGROUND OF THE INVENTION

1. Field of the Invention

The present invention generally relates to the semiconductor device field, and more particularly, to a fin transistor structure and a method of fabricating the same.

2. Description of the Related Art

Fin transistor devices such as FinFETs are being in focus because of their good cut-off characteristics, excellent scalability, and compatibility with the conventional manufacturing processes. So far, conventional FinFETs are mainly categorized into two types: FinFETs formed on a Silicon On Insulator (SOI) substrate, and FinFETs formed on a bulk Si substrate (bulk-FinFET). The bulk-FinFET has many advantages over the FinFET on the SOI substrate, such as low cost, low body effect, low back-biased effect, and high heat transfer.

Document 1 (Tai-su Park el al., "Body-tied triple-gate NMOSFET fabrication using bulk Si wafer", Solid-state Electronics 49(2005), 377-383) discloses a body-tied triple-gate NMOSFET fabricated by using a bulk Si wafer. FIG. 1 of this document illustrates a perspective view of this FET, and FIG. 2 shows the method of fabricating the FET in detail. As shown in FIGS. 1 and 2(f), a gate electrode of poly-silicon is formed across a fin where the channel of the semiconductor device is positioned. However, as clearly shown in FIG. 2(f), the channel has its bottom portion surrounded by $Si_3N_4$ and $SiO_2$. As a result, the gate electrode cannot effectively control this portion. Thus, even in the off state, a current path may be formed between source and drain regions through the bottom portion of the channel, resulting in leakage current.

Document 2 (K. Okano el al., "Process Integration Technology and Device Characteristics of CMOS FinFET on Bulk Silicon Substrate with sub-10 nm Fin Width and 20 nm Gate Length", IEDM 2005) discusses the above problem in more detail. Specifically, referring to FIG. 4 thereof, leakage current densities are shown for different portions of the fin. It can be seen that the leakage current density at the bottom of the channel is hundreds or even thousands of times greater than that at the channel region.

To solve the problem of leakage current, a punch through stop (PTS) structure may be introduced at the bottom of the channel so as to suppress the leakage current, as described in Document 2. In order to form such PTS structure at the bottom of the channel, high-energy ion implantation is often required. However, this will cause a broad distribution of the implanted dopants, and also high density of dopants in the channel region (referring to FIG. 5 of Document 2). Thus, such a structure is accompanied by large junction leakage and large junction capacitance.

Therefore, there is a need for a novel structure and a method for fabricating fin transistors, whereby it is possible to effectively reduce the leakage current at the bottom of the channel while maintaining the advantages of bulk-FinFETs, without causing high junction leakage and high junction capacitance.

SUMMARY OF CERTAIN INVENTIVE ASPECTS

In view of the above problems, it is an object of the present invention to provide a fin transistor structure and a method of fabricating the same, whereby it is possible to reduce the leakage current while maintaining advantages of body-tied structures.

According to an aspect of the present invention, there is provided a method of fabricating a fin transistor structure, comprising: providing a bulk semiconductor substrate; patterning the semiconductor substrate to form a fin with its body directly tied to the semiconductor substrate; patterning the fin so that gaps are formed on the bottom of the fin at source/drain regions of the transistor structure to be formed, wherein a portion of the fin corresponding to the channel region of the transistor structure to be formed is directly tied to the semiconductor substrate, while other portions of the fin at the source/drain regions are separated from the surface of the semiconductor substrate by the gaps; filling an insulation material into the gaps; and fabricating the transistor structure based on the semiconductor substrate with the fin formed thereon.

Preferably, the bulk semiconductor substrate may comprise Si, Ge, SiC, SiGe, or a group-III-V semiconductor material, or any combination thereof. Further preferably, the group-III-V semiconductor material comprises GaAs, InP, or GaN, or any combination thereof.

Preferably, the insulation material may comprise $SiO_2$ or $Si_3N_4$, or a high-k dielectric material, or any combination thereof. Further preferably, the high-k dielectric material comprises $HfO_2$, $ZrO_2$, $Al_2O_3$, $TiO_2$, or $La_2O_3$, or any combination thereof.

Preferably, the step of patterning the fin comprises: forming a first etching protection layer on the surface of the semiconductor substrate and on the top of the fin; forming a hard mask layer on top of the first etching protection layer; forming a second etching protection layer on the sidewalls of the fin; patterning the hard mask layer to define the gaps; etching the fin to form the gaps therein; and removing the hard mask layer, the first etching protection layer, and the second etching protection layer.

Preferably, the step of forming the first etching protection layer on the surface of the semiconductor substrate and on the top of the fin comprises: forming a first etching protection layer by deposition, which is thicker on the surface of the semiconductor substrate and on the top of the fin and thinner on the sidewalls of the fin; and etching the first etching protection layer to remove a portion thereof on the sidewalls of the fin.

Preferably, the step of forming the hard mask layer on the top of the first etching protection layer comprises: forming a hard mask layer by deposition, which is thicker on the first etching protection layer and thinner on the sidewalls of the fin; and etching the hard mask layer to remove a portion thereof on the sidewalls of the fin.

Preferably, the step of forming the second etching protection layer on the sidewalls of the fin comprises: conformally forming a second etching protection layer by deposition; and etching the second etching protection layer to remove a portion thereof on the hard mask, so that the second etching protection layer only exists on the sidewalls of the fin.

Preferably, the step of patterning the hard mask layer comprises: selectively etching the hard mask layer to expose the bottom portion of the fin at the source/drain regions of the transistor structure to be formed, while other portions of the fin as well as the surface of the semiconductor substrate are covered by the first etching protection layer, the second etching protection layer and/or the hard mask layer.

Preferably, the first etching protection layer and the second etching protection layer may comprise $SiO_2$, and the hard mask layer may comprise $Si_3N_4$.

Preferably, the step of fabricating the transistor structure based on the semiconductor substrate with the fin formed thereon comprises: forming a buffer layer on the semiconductor substrate with the fin formed thereon; forming a stop layer on the buffer layer; forming an isolation layer on the stop layer, and performing planarization on the isolation layer to expose the stop layer above the fin; removing a portion of the stop layer to expose the buffer layer above the top of the fin and recess the stop layer on both sides of the fin above the substrate, and removing a portion of the isolation layer to recess the isolation layer above the substrate; etching portions of the stop layer and portions of the isolation layer on both sides of the fin above the substrate, so as to expose the top portion of the buffer layer on both sides of the fin above the substrate; etching a portion of the exposed buffer layer to expose the fin corresponding to the channel region to be formed; forming a gate dielectric layer on the exposed portion of the fin; and forming a gate electrode which intersects the fin and extends away from both sides of the fin above the substrate.

According to another aspect of the invention, there is provided a fin transistor structure, comprising: a bulk semiconductor substrate, and a fin with its body partially tied to the semiconductor substrate, wherein a portion of the fin at a channel region is directly tied to the semiconductor substrate, while other portions of the fin at source/drain regions are separated from the surface of the semiconductor substrate by an insulation material.

In the fin transistor structure according to embodiments of the invention, the portion of the fin at the channel region is directly tied to the semiconductor substrate, resulting in a body-tied structure. This ensures that the fin transistor structure of the present invention can maintain the advantages of bulk FinFETs. Further, the insulation material is filled between the bottom portion of the fin at the source/drain regions and the semiconductor substrate, resulting in a SOI like structure, which effectively reduces the leakage current. Since there is no punch through stop (PTS) structure which needs heavy doping in the present invention, there should be no concern about high junction leakage and high junction capacitance due to heavy doping.

BRIEF DESCRIPTION OF THE DRAWINGS

The above and other objects, features and advantages of the present invention will be more apparent by describing embodiments thereof in detail with reference to the attached drawings, wherein:

FIG. 10 shows a fin structure according to an embodiment of the invention, wherein FIG. 10(a) is a perspective view, FIG. 10(b) is a section view taken along the line A-A', and FIG. 10(c) is a section view taken along the line B-B'; FIG. 18(d) is a section view taken along the line C-C'.

DETAILED DESCRIPTION OF CERTAIN ILLUSTRATIVE EMBODIMENTS

Figure 1:
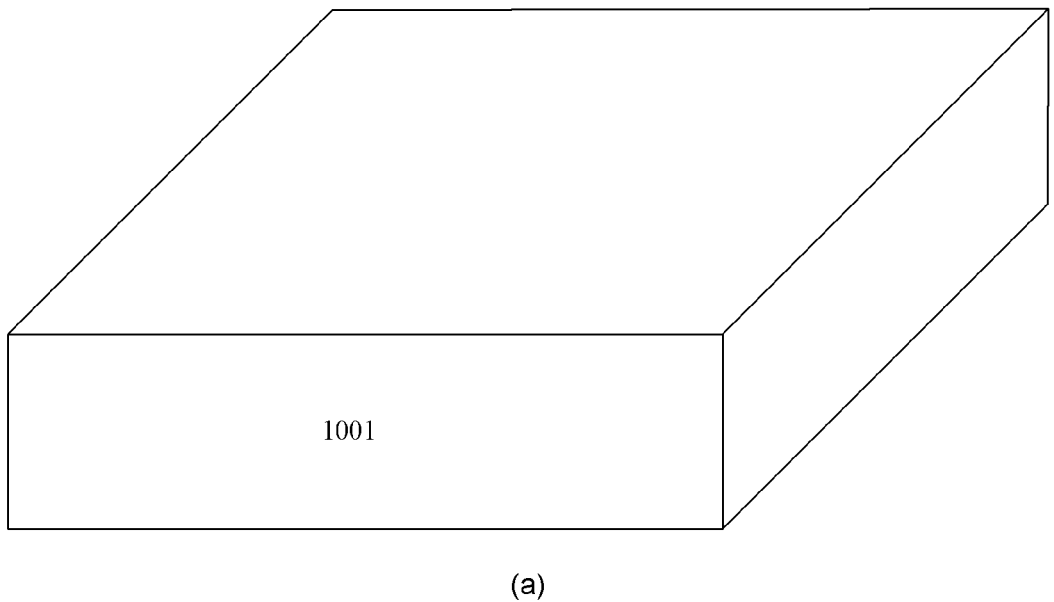
FIGS. 1-7 show intermediate structures during a fabricating process according to an embodiment of the invention respectively, wherein parts (a) of the respective figures are perspective views, and parts (b) of the respective figures are section views.
Figure 1:
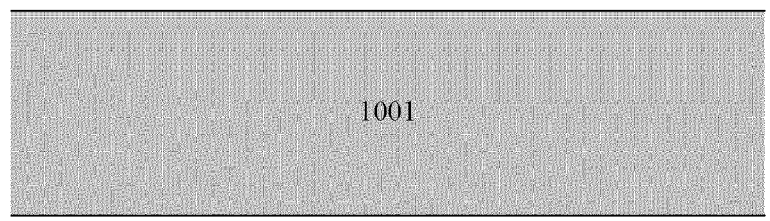

Hereinafter, the present invention is described with reference to embodiments shown in the attached drawings. However, it is to be understood that those descriptions are just provided for illustrative purpose, rather than limiting the present invention. Further, in the following, descriptions of known structures and techniques are omitted so as not to obscure the concept of the present invention.

In the drawings, various structural diagrams and sectional views of semiconductor devices according to embodiments of the present invention are shown. However, they are not drawn to scale, and some features may be enlarged while some features may be omitted for clarity. Shapes, sizes and relative locations of respective regions and layers shown in the drawings are just illustrative, and deviations therefrom may occur due to manufacture tolerances and technical limits. Those skilled in the art can also devise regions/layers of different shapes, sizes and relative locations as desired.

According to an embodiment of the present invention, there are provided a novel fin structure and a method of fabricating it. The fin is formed by patterning a semiconductor substrate so that the fin is integral with the semiconductor substrate, wherein the body of the fin is partially tied to the semiconductor substrate, i.e. the portion of the fin at the channel region is directly tied to the semiconductor substrate, while other portions of the fin at the source/drain regions are separated from the surface of the semiconductor substrate by insulation material.

As a result, the channel region is situated on the bulk material, causing the same advantages as bulk-FinFETs. The remaining portion of the fin is situated on the insulation material, just like FinFETs being formed on a SOI substrate, whereby it is possible to significantly reduce the leakage current.

FIGS. 1-7 show intermediate structures during a fabricating process according to an embodiment of the invention, wherein part (a) of each of the drawings is a perspective view, and part (b) of each of the drawings is a section view.

As shown in FIG. 1, a bulk semiconductor substrate 1001 of semiconductor materials is provided. For example, the bulk semiconductor substrate 1001 may comprise Si. Alternatively, other materials such as Ge, SiC, SiGe or a group-III-V semiconductor material, or any combination thereof are apparent for those skilled in the art. For instance, the group-III-V semiconductor material comprises GaAs, InP, or GaN, or any combination thereof.

Figure 2:
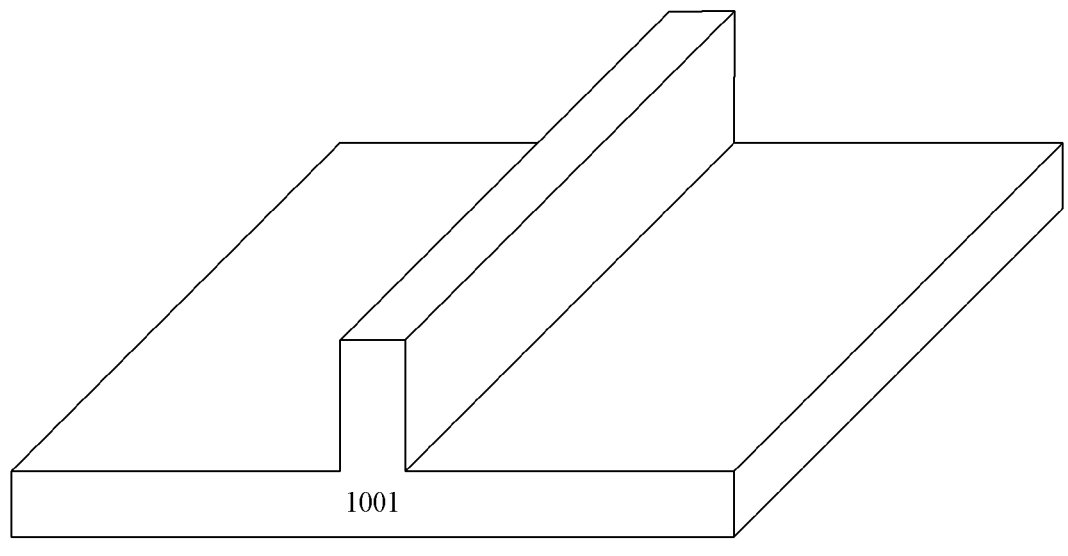
Figure 2:
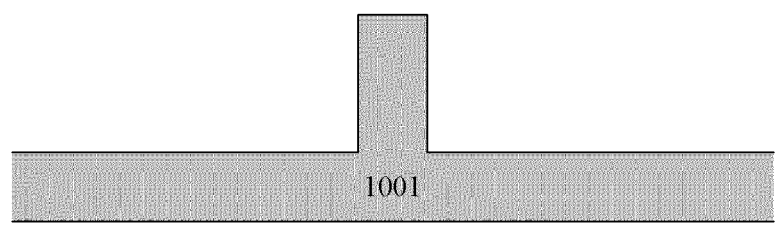

Next, as shown in FIG. 2, the semiconductor substrate 1001 is patterned, for example, by exposure through a mask, etch, and the like, so as to form a fin with its body tied to the semiconductor substrate 1001.

In order that the portions of the fin at the source/drain regions of the transistor structure to be formed are separated from the surface of the semiconductor substrate by insulation material, the fin shown in FIG. 2 should be patterned so that the portions of the fin at the source/drain regions are spaced from the semiconductor substrate by gaps, into which an insulation material may be filled later to form the insulator.

Figure 3:
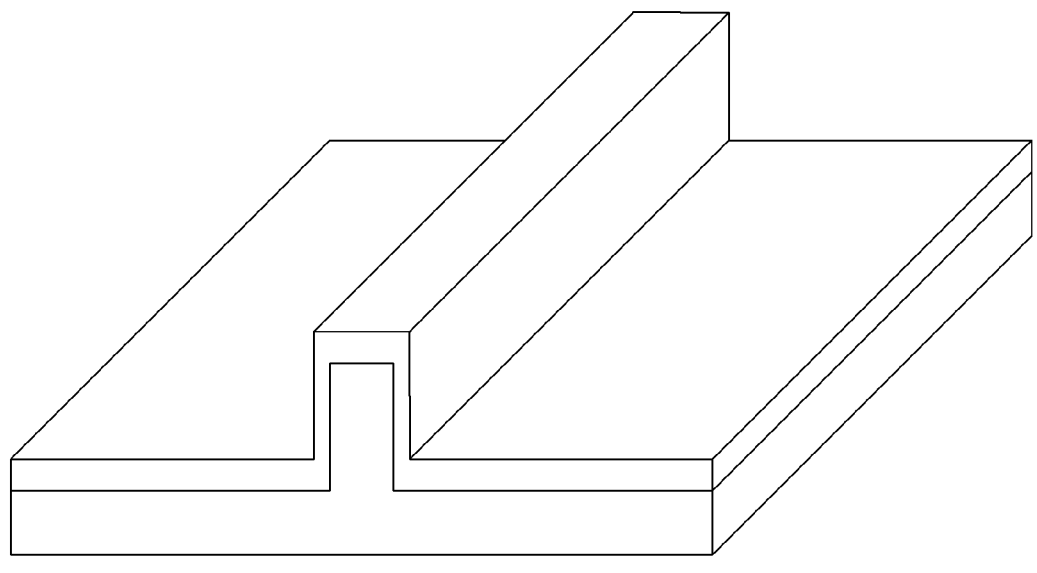
Figure 3:
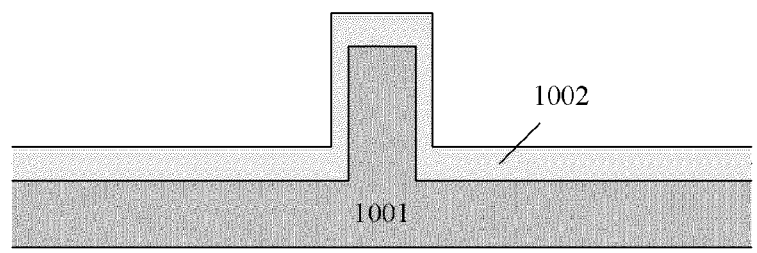
Figure 4:
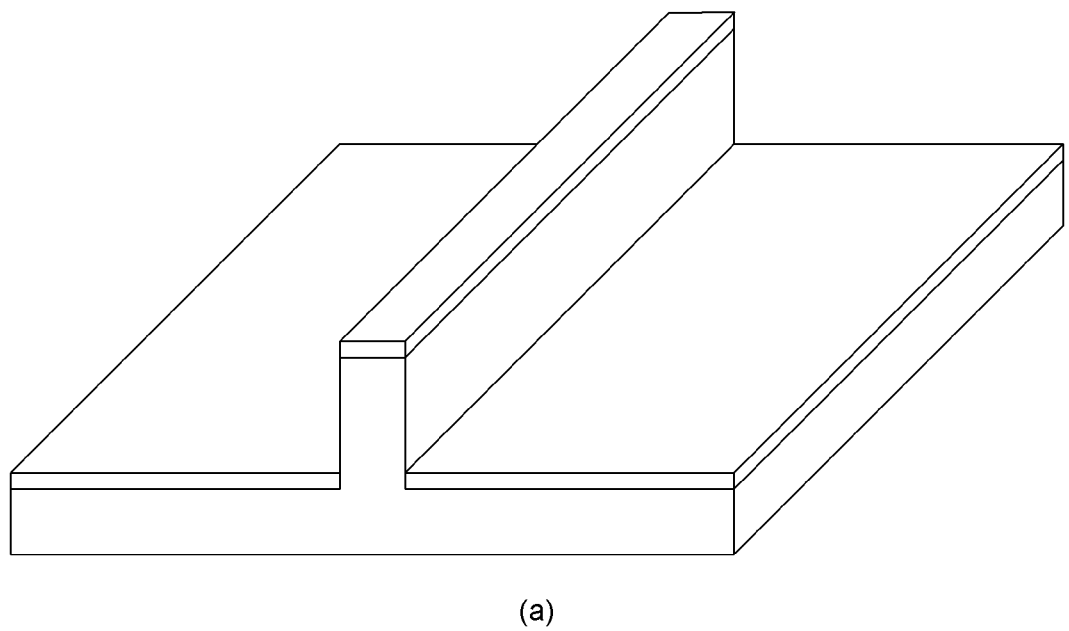
Figure 4:
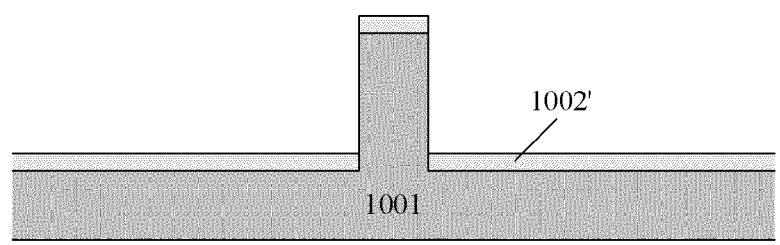

To do this, firstly, as shown in FIGS. 3 and 4, a first etching protection layer may be formed on the surface of the semiconductor substrate 1001 and also on the top of the fin, so as to protect the surface of the semiconductor substrate 1001 and the top of the fin from damages in etching to form the gaps. Specifically, as shown in FIG. 3, a first etching protection layer 1002 is deposited on the surface of the semiconductor substrate 1001. For example, the first etching protection layer 1002 comprises $SiO_2$. Here, the deposition may be carried out in various ways, comprising but not limited to Chemical Vapor Deposition (CVD), Molecule Beam Epitaxy (MBE), and evaporation. This layer is deposited in such a manner that the first etching protection layer 1002 is thicker on the surface of the semiconductor substrate 1001 and on the top of the fin, and is thinner on sidewalls of the fin. Subsequently, as shown in FIG. 4, the first etching protection layer 1002 is thinned, for example, by etching such as Reactive Ion Etching (RIE). Since the first etching protection layer 1002 is thicker on the surface of the semiconductor substrate 1001 and on the top of the fin, and is thinner on the sidewalls of the fin, the first etching protection layer 1002 only exists on the surface of the semiconductor substrate 1001 and on the top of the fin after a certain period, so as to expose the sidewalls of the fin, as shown in FIG. 4. The reference numerals 1002 and 1002' refer to the same first etching protection layer at different stages prior to and after being etched.

Figure 5:
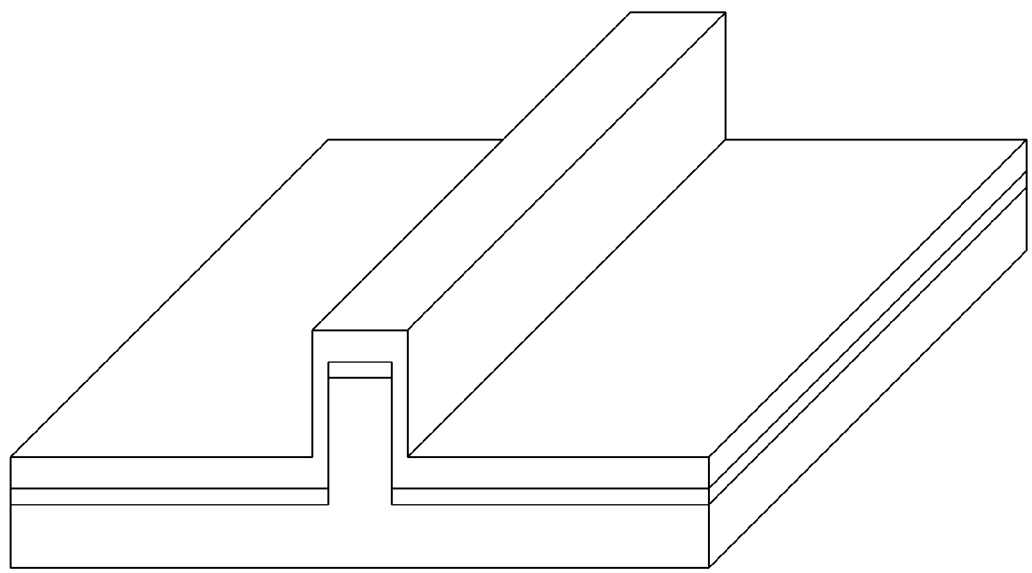
Figure 5:
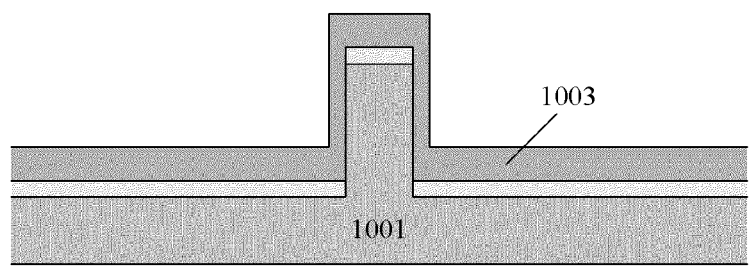
Figure 6:
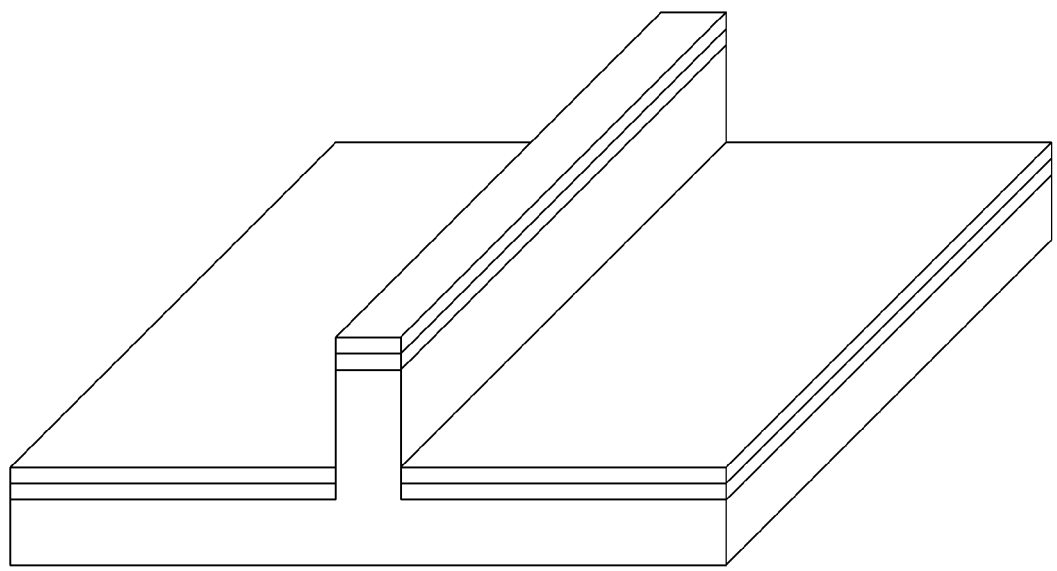
Figure 6:
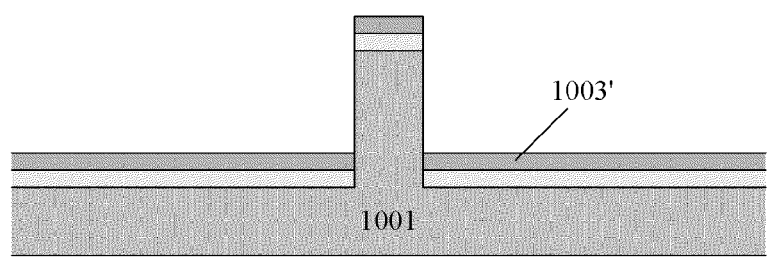

Next, a hard mask layer is formed on the first etching protection layer for defining the gaps to be formed later. Specifically, as shown in FIG. 5, a hard mask layer 1003 is deposited on the structure shown in FIG. 4. For example, the hard mask layer 1003 comprises $Si_3N_4$. For example, this layer is deposited similarly to the first etching protection layer 1002, so that the hard mask layer 1003 is thinner on the sidewalls of the fin and thicker on the top of the first etching protection layer 1002. Subsequently, as shown in FIG. 6, the hard mask layer 1003 is thinned, for example, by etching such as RIE. Since the hard mask layer 1003 is thinner on the sidewalls of the fin and thicker on the top of the first etching protection layer 1002, the hard mask layer 1003 only exists above the semiconductor substrate and above the top of the fin after a certain period, still exposing the sidewalls of the fin, as shown in FIG. 6. The thickness of the hard mask layer 1003' remaining on the first etching protection layer substantially corresponds to the height of the gap to be formed. The reference numerals 1003, 1003' and 1003" refer to the same hard mask layer at stagers differing by etching and patterning.

Figure 7:
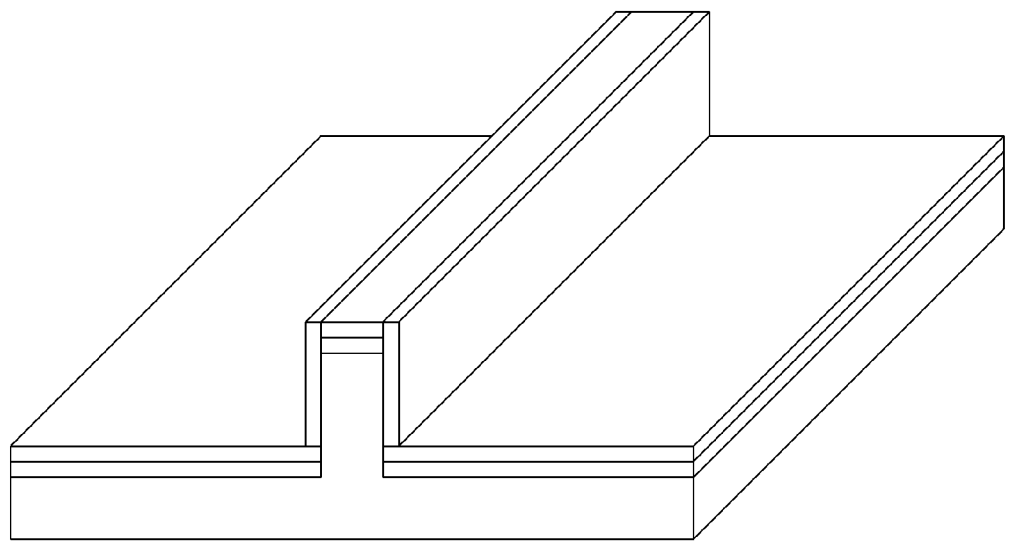
Figure 7:
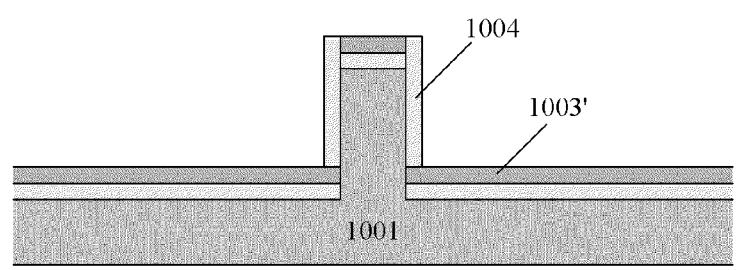

Then, as shown in FIG. 7, a second etching protection layer 1004 is formed on the exposed sidewalls of the fin to protect the sidewalls of the fin from damages in the step of etching to form the gaps. For example, the second etching protection layer 1004 may comprise $SiO_2$. Specifically, a second etching protection layer (for example, $SiO_2$) is deposited conformally on the structure shown in FIG. 6, and then is etched for example by RIE so that it only remains on the sidewalls of the fin as shown in FIG. 7.

Next, the hard mask layer 1003 may be patterned to define the gaps to be formed.

Figure 8:
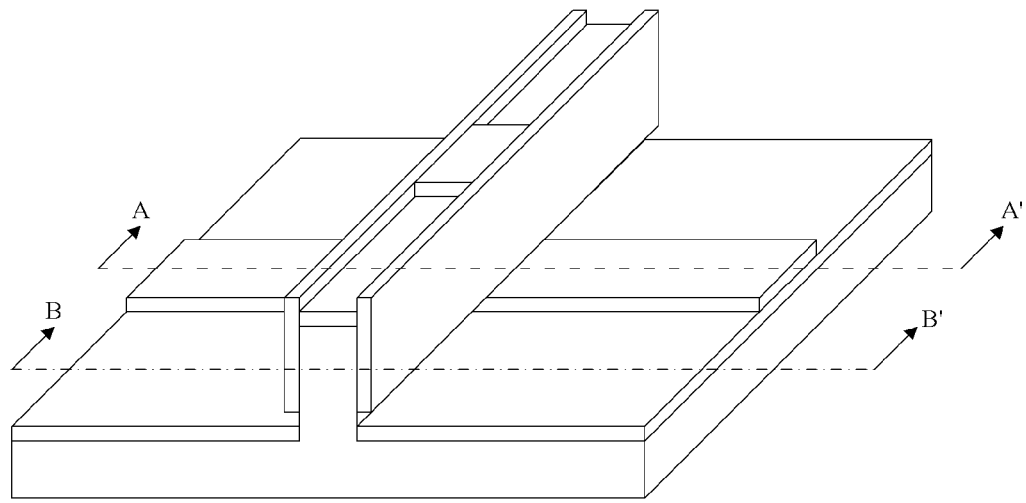
FIGS. 8-9 show intermediate structures during a fabricating process according to an embodiment of the invention respectively, wherein parts (a) of the respective figures are perspective views, parts (b) of the respective figures are section views taken along the line A-A', and parts (c) of the respective figures are section views taken along the line B-B'.
Figure 8:
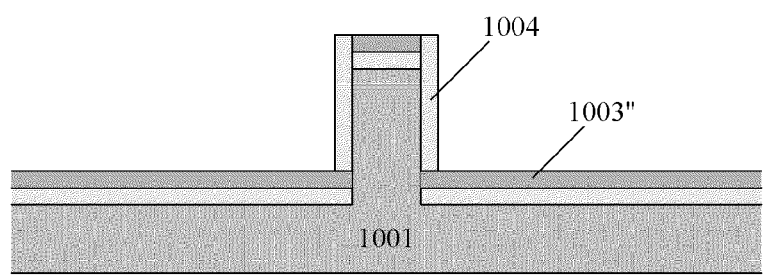
Figure 8:
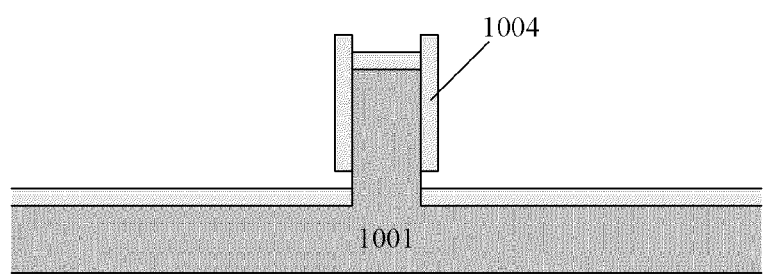
Figure 9:
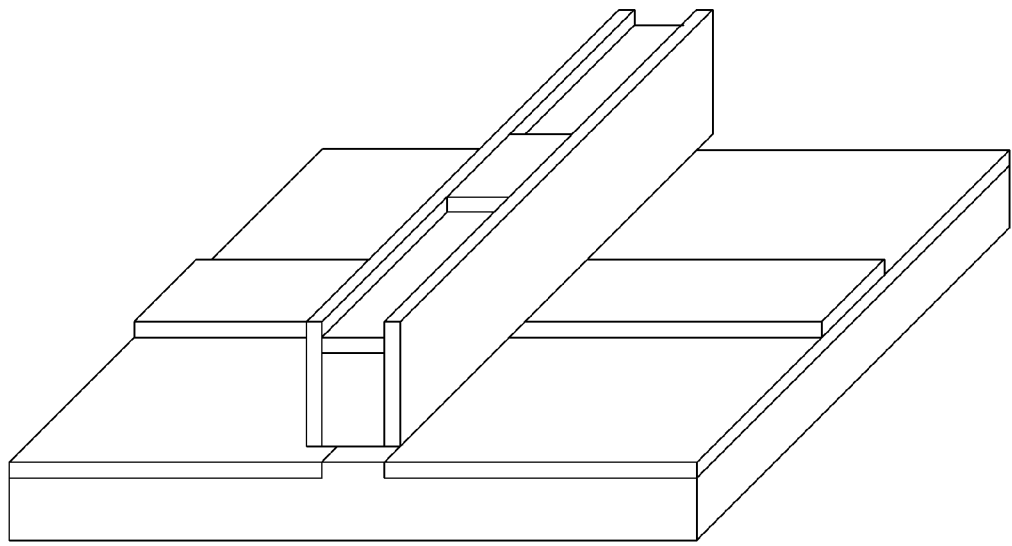
Figure 9:
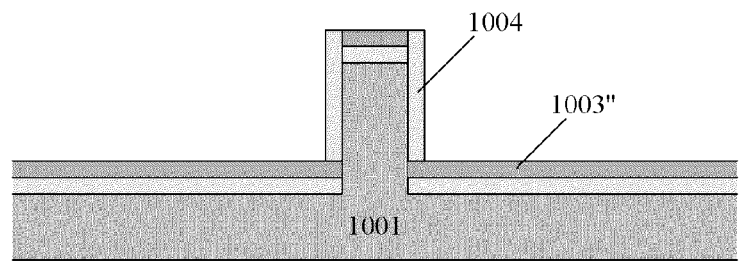
Figure 9:
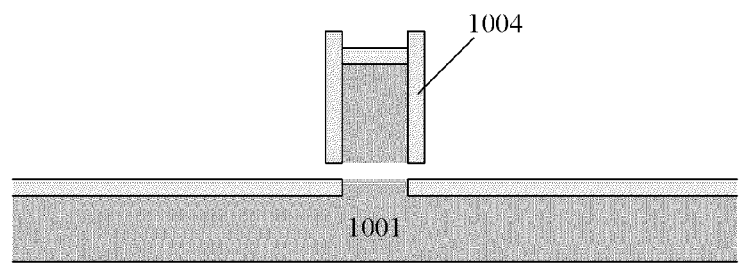

FIGS. 8-9 show intermediate structures during the fabricating process according to the embodiment of the invention, wherein part (a) of each of the drawings is a perspective view, part (b) of each of the drawings is a section view taken along the line A-A', and part (c) of each of the drawings is a section view taken along the line B-B' (for clarity, here lines A-A' and B-B' are omitted in FIG. 9, positions thereof are the same as those shown in FIG. 8; the same is true for the other drawings as followed).

As shown in FIG. 8, the hard mask layer may be patterned by photolithography for example, so that it only remains at a position corresponding to a gate region to be formed, exposing the bottom portion of the fin corresponding to the gaps to be formed (referring to FIGS. 8(a) and 8(c)). Other portions of the fin and the surface of the semiconductor substrate are covered by the first etching protection layer 1002 and the second etching protection layer 1004 and/or the hard mask layer 1003" (referring to FIGS. 8(a) and 8(b)). Specifically, for example, a layer of photoresist may be coated, and is exposed through a mask and then developed, so that the photoresist only remains at the position corresponding to the gate region to be formed. Then, an etchant which has selectivity between the hard mask layer 1003' (for example, $Si_3N_4$) and the etching protection layers (for example, $SiO_2$) is used to perform etching. Thus, portions of the hard mask layer 1003' ($Si_3N_4$) only remains at the position corresponding to the gate region to be formed, while the first etching protection layer 1002 and the second etching protection layer 1004 ($SiO_2$) are kept as they are. Then, the photoresist is removed to obtain the patterned hard mask layer 1003" shown in FIG. 8.

Next, as shown in FIG. 9, the structure shown in FIG. 8 is selectively etched to remove the exposed portion of the fin at its bottom, so as to form the gaps (referring to FIG. 9(c)), the height of which is in a range of about 50 to about 500 Å. Specifically, an etchant which has selectivity between the substrate material (for example, Si) and the hard mask layer 1003" (for example, $Si_3N_4$) and also the two etching protection layers (for example, $SiO_2$) is used to perform etching. Thus, the exposed portion of the fin (Si) is removed. Due to the presence of the first etching protection layer 1002, the second etching protection layer 1004 as well as the hard mask layer 1003", the semiconductor substrate and the fin covered thereby are protected from the etching (referring to FIG. 9(b)).

In fact, all the steps shown in FIGS. 3-9 function to pattern the fin in a T-like shape (referring to FIG. 10) so that the remaining portion of the fin at the source/drain regions is spaced from the surface of the semiconductor substrate by the gaps. It is apparent to those skilled in the art that there may be various ways to form the fin in such T-like shape, for example, by properly providing etching protection layer(s) and mask layer(s), and then etching.

Subsequently, the first etching protection layer 1002, the second etching protection layer 1004 and the hard mask layer 1003" are removed, for example, by selective etching, and an insulation material 1005 is filled into the gaps. For example, the insulation material 1005 may comprise $SiO_2$, $Si_3N_4$, or a high-k dielectric material or nay combination thereof Preferably, the high-k dielectric material comprises $HfO_2$, $ZrO_2$, $Al_2O_3$, $TiO_2$, or $La_2O_3$, or any combination thereof The filling may be performed by depositing a layer of the insulation material and then etching back this layer by RIE, for example.

Figure 10:
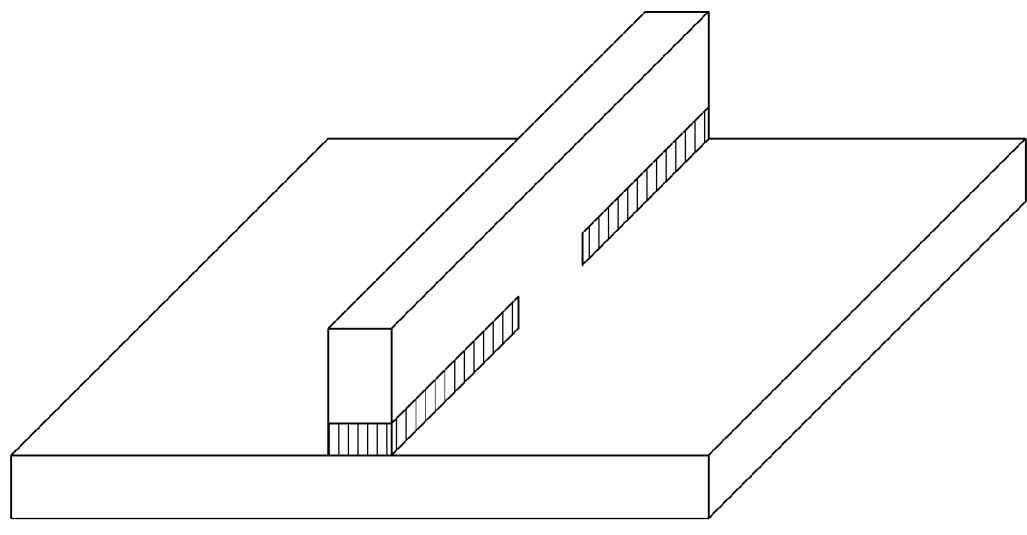
Figure 10:
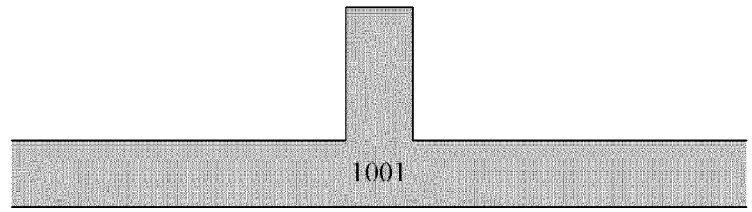
Figure 10:
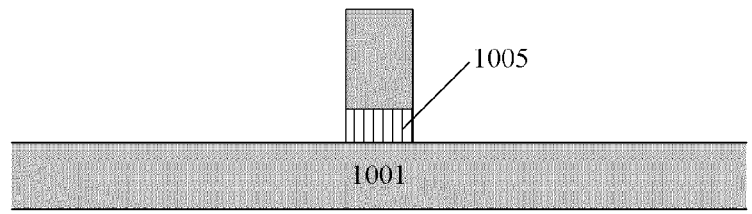

FIG. 10 shows a fin structure according to an embodiment of the invention, wherein FIG. 10(a) is a perspective view, FIG. 10(b) is a section view taken along the line A-A', and FIG. 10(c) is a section view taken along the line B-B'.

As shown in FIG. 10, in this fin structure, the fin is integrally formed with the semiconductor substrate 1001. Especially, the portion of the fin serving as the channel region is directly tied to the semiconductor substrate 1001 (referring to FIG. 10(b)). That is, a body-tied structure is formed at the channel region. Further, the insulation material 1005 is filled between other portions of the fin at the source/drain regions and the surface of the semiconductor substrate 1001 (referring to FIG. 10(*c*)), resulting in a SOI like structure.

One embodiment of forming the fin structure of the invention is described as above. Those skilled in the art can conceive other ways to form the fin structure.

After the fin structure is formed on the substrate as described above, a transistor structure may be formed in various ways. Hereinafter, one example of forming the transistor structure is described so that those skilled can better understand the present invention.

FIGS. 11-18 show structures at respective steps of fabricating a transistor structure based on the above fin structure according to an embodiment of the present invention respectively, wherein in respective drawings (a) is a perspective view, (b) is a section view taken along the line A-A', and (c) is a section view taken along the line B-B'.

Figure 11:
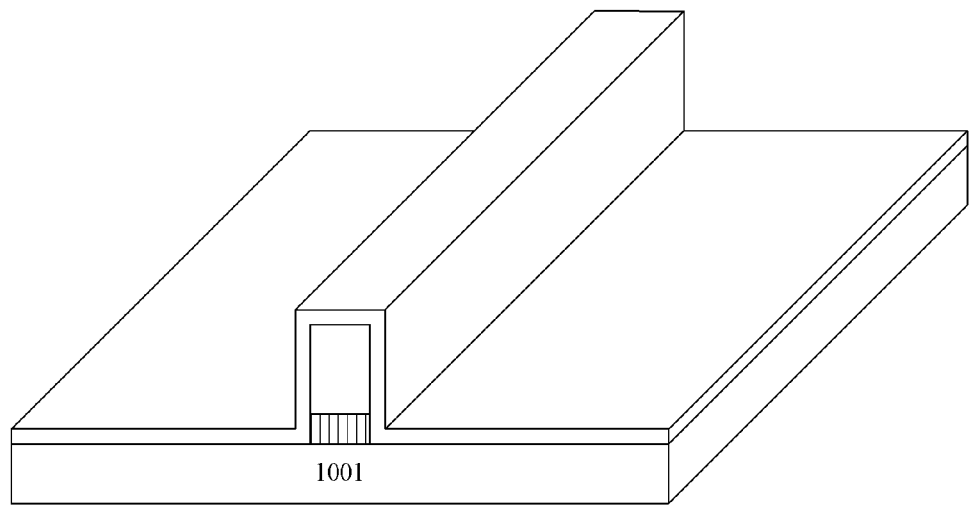
FIGS. 11-18 show structures at respective steps of fabricating a transistor structure based on the above fin structure according to an embodiment of the present invention respectively, wherein parts (a) of the respective figures are perspective views, parts (b) of the respective figures are sections view taken along the line A-A', parts (c) of the respective figures are section views taken along the line B-B'.
Figure 11:
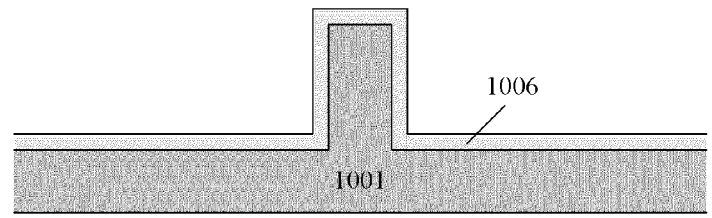
Figure 11:
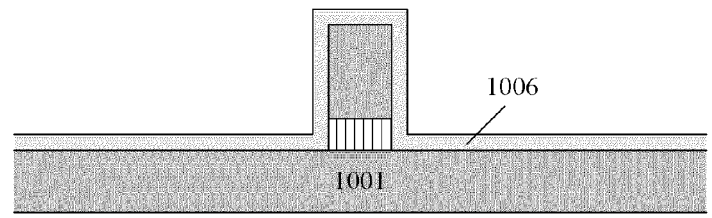
Figure 12:
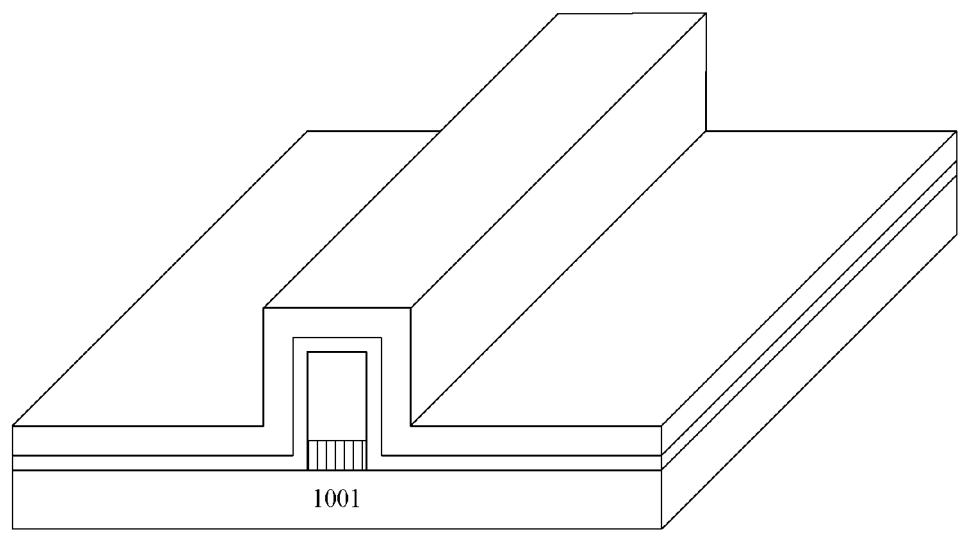
Figure 12:
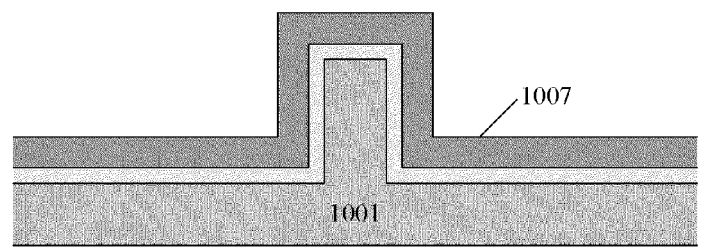
Figure 12:
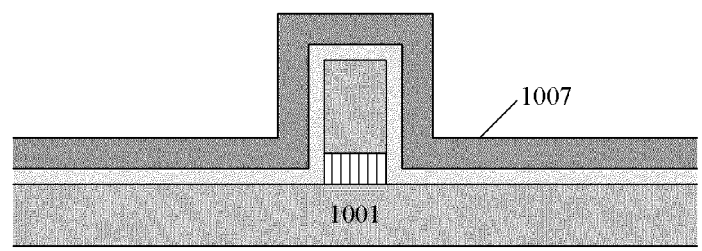
Figure 13:
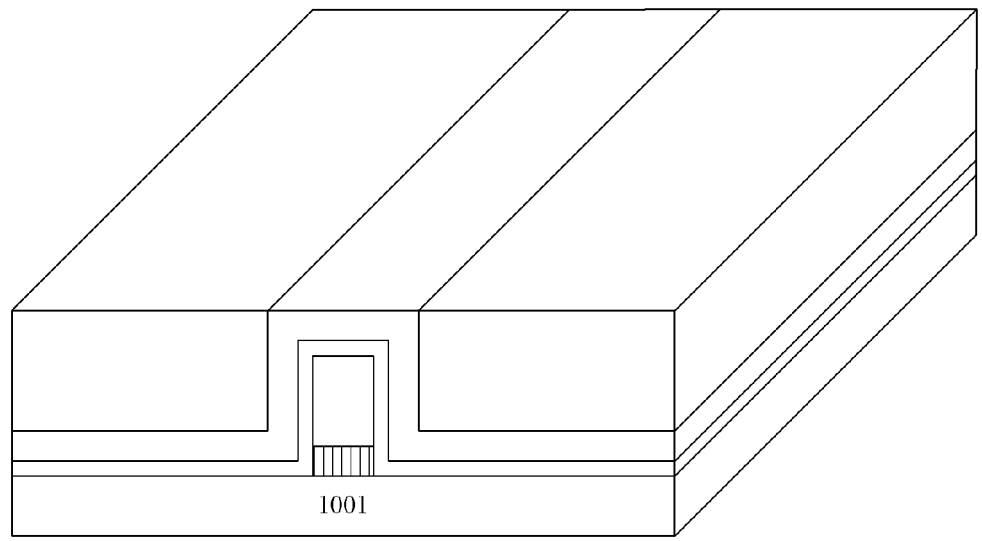
Figure 13:
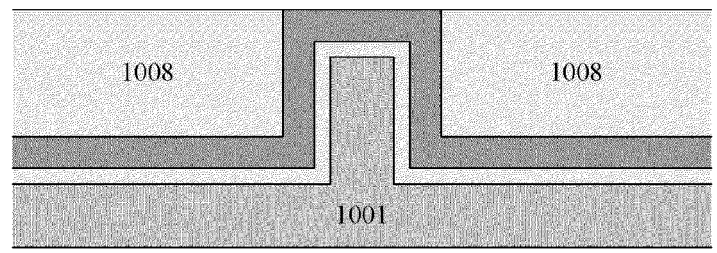
Figure 13:
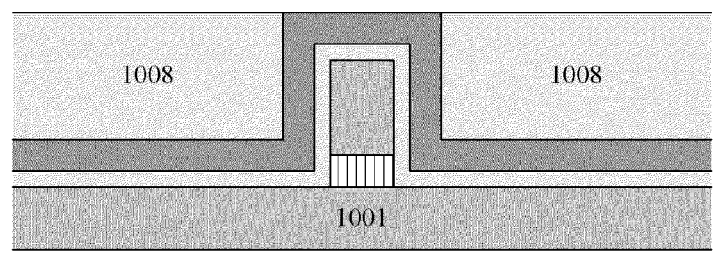

As shown in FIG. 11, a buffer layer 1006 is formed (for example, by deposition) on the substrate having the fin formed thereon as shown in FIG. 10. The buffer layer 1006 may be formed of $SiO_2$, for example. Then, as shown in FIG. 12, a stop layer 1007 is formed (for example, by deposition) on the buffer layer 1006. The stop layer 1007 may be formed of $Si_3N_4$, for example. Next, as shown in FIG. 13, on the resulting structure, an isolation layer 1008 is deposited. The isolation layer 1008 may be formed of $SiO_2$, for example. Preferably, planarization, for example, chemical mechanical polishing (CMP), is performed on the deposited isolation layer 1008 until the stop layer 1007 is exposed.

Figure 14:
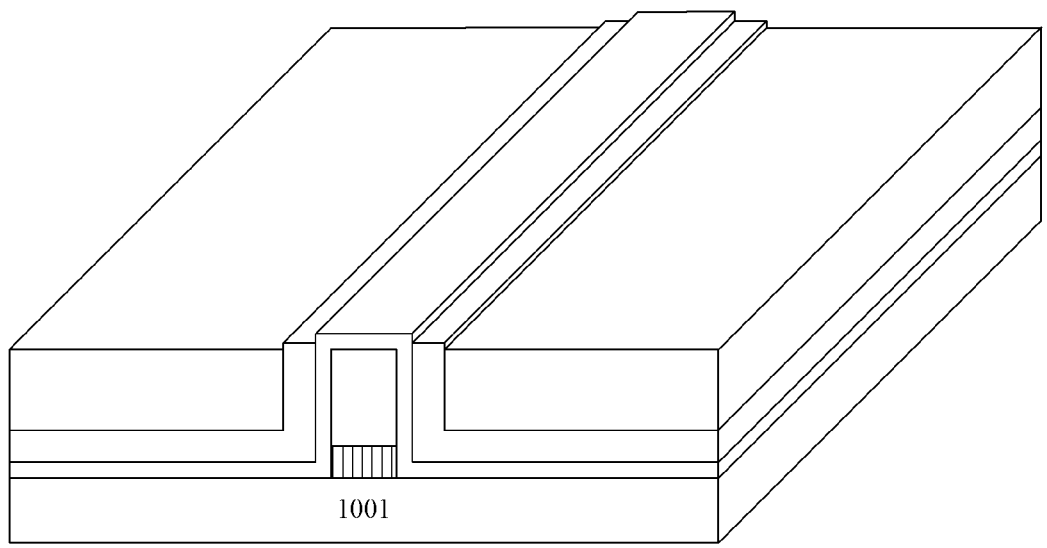
Figure 14:
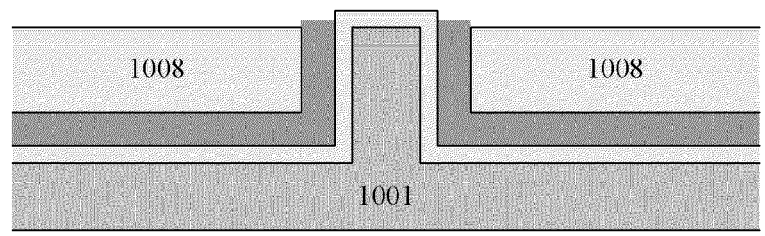
Figure 14:
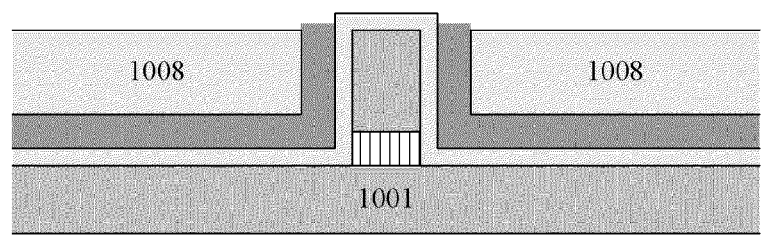
Figure 15:
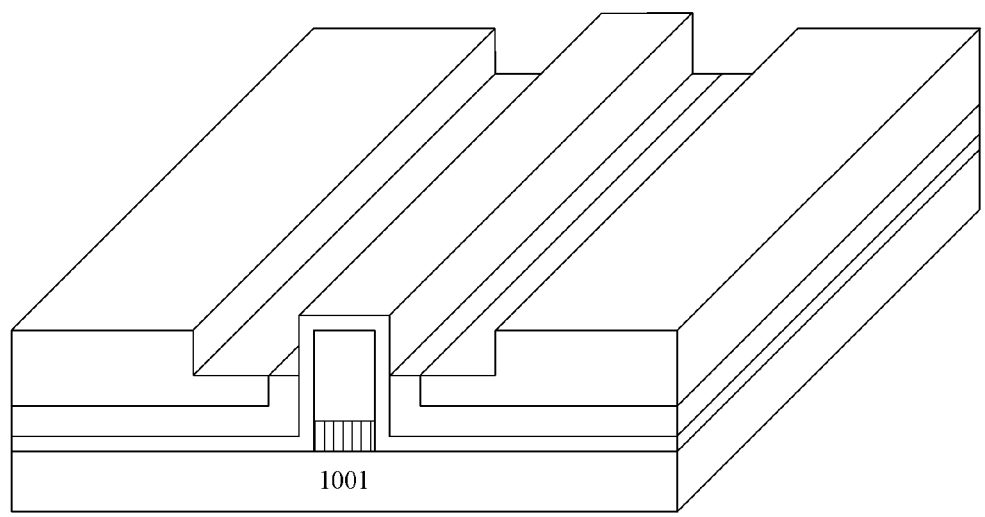
Figure 15:
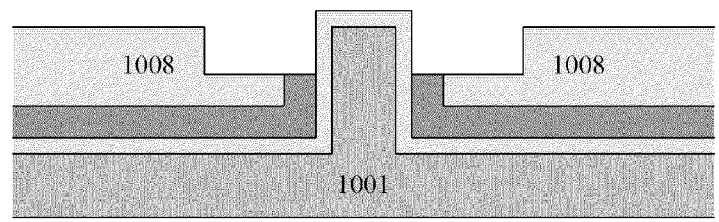
Figure 15:
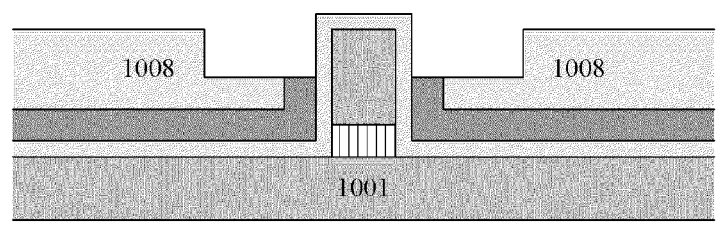
Figure 16:
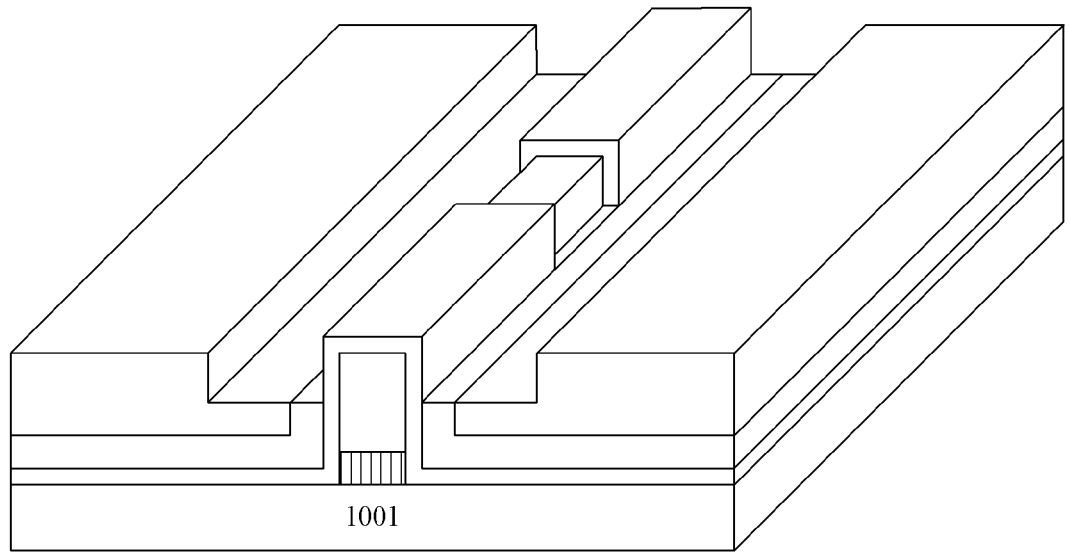
Figure 16:
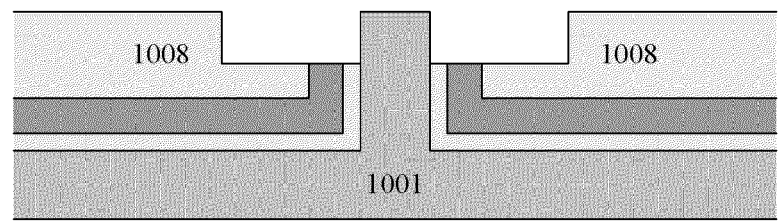
Figure 16:
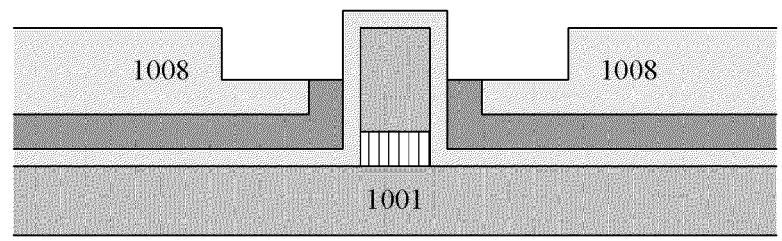

Then, as shown in FIG. 14, a portion of the stop layer 1007 is selectively etched away to expose the buffer layer 1006 above the top of the fin and recess the stop layer on both sides of the fin above the substrate 1001. Further, a portion of the isolation layer 1008 is removed so that the isolation layer 1008 is recessed above the substrate 1001. Next, as shown in FIG. 15, the stop layers 1007 and portions of the isolation layer 1008 are further etched on both sides of the fin above the substrate 1001, so as to further expose the fin structure. Then, as shown in FIG. 16, at the position corresponding to the gate region to be formed, a portion of the buffer layer 1006 is etched away, so as to expose the fin corresponding thereto (the exposed portion of the fin body corresponds to the channel region).

Figure 17:
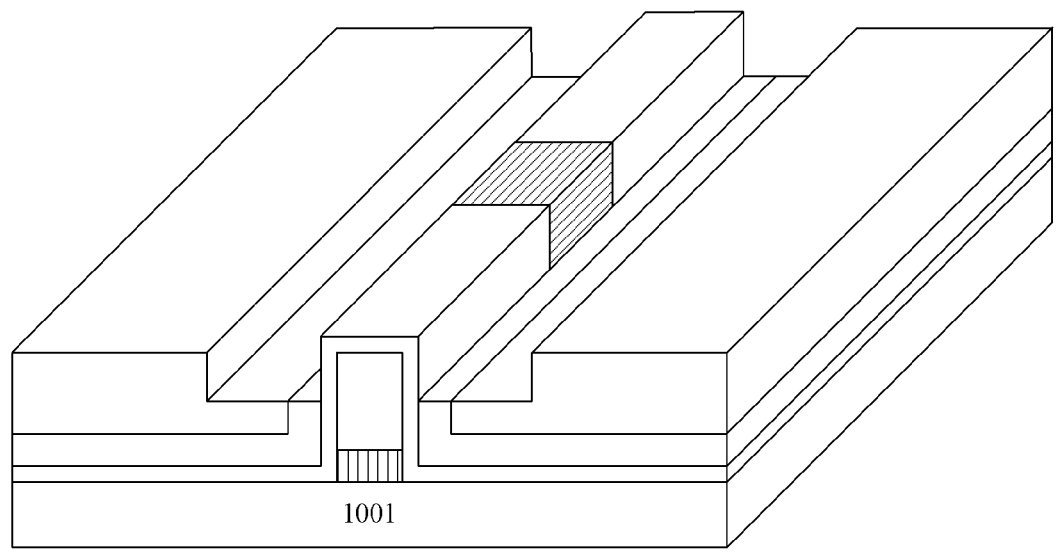
Figure 17:
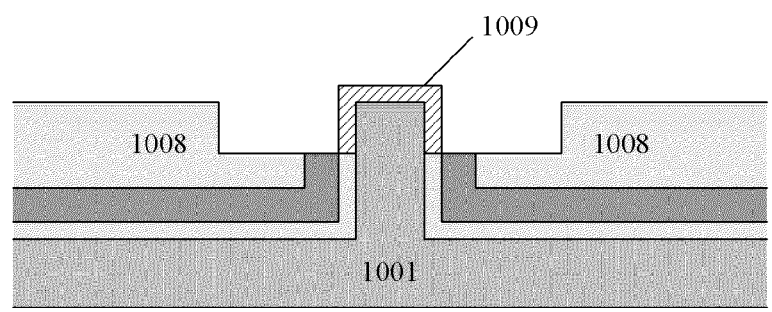
Figure 17:
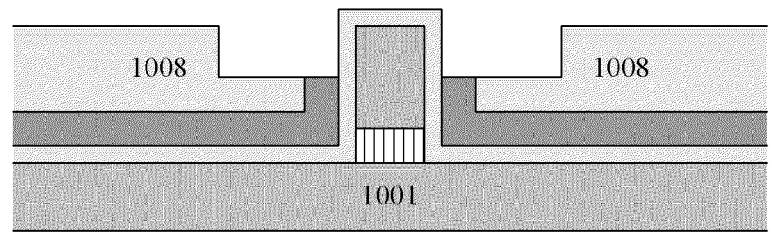
Figure 18:
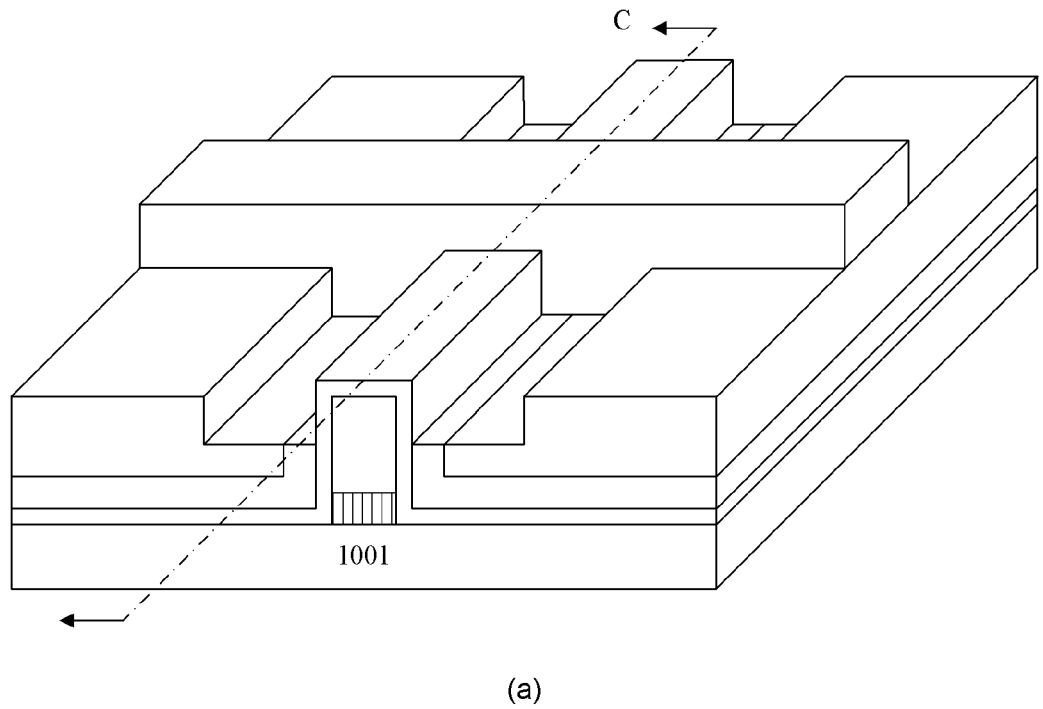
Figure 18:
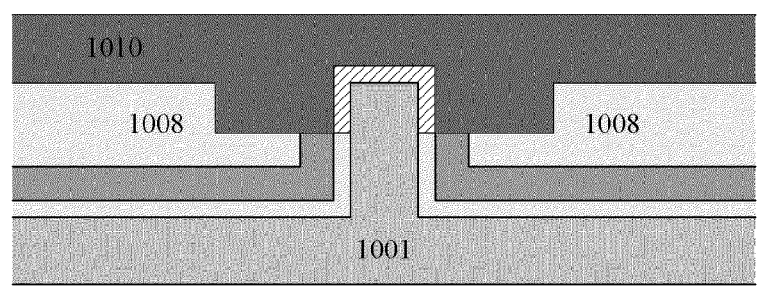
Figure 18:
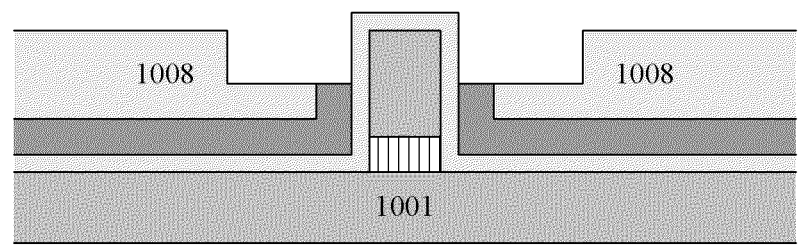
Figure 18:
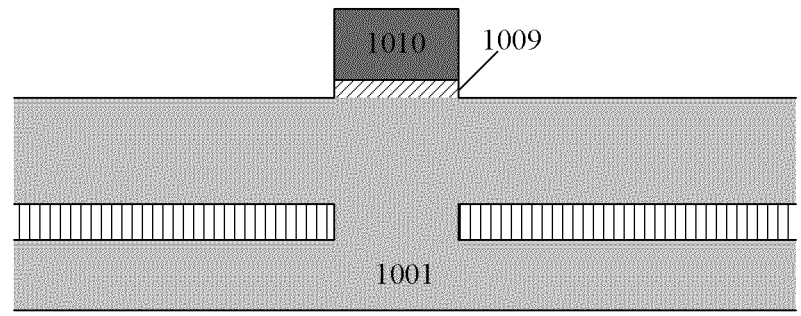

Then, as shown in FIG. 17, a gate dielectric layer 1009 is formed on the exposed portion of the fin body. The gate dielectric layer 1009 may be formed of $SiO_2$, SiON or high k materials, for example. Next, as shown in FIG. 18, a gate electrode 1010 is formed. The gate electrode 1010 may intersect the fin and extend away from both sides of the fin above the substrate 1001, and indirectly contact the fin via the gate dielectric layer 1009. The gate electrode 1010 may be a polysilicon gate electrode, or may be a metal gate electrode such as TiN, TiAlN, and TaN.

After forming the gate electrode, the source and drain regions may be doped by means of ion implantation, so as to finally form the transistor structure according to the embodiment. The formation of such source/drain regions is not directly relevant to the subject matter of the invention, and thus is omitted here.

FIG. 18(*d*) is a section view taken along the line C-C' showing the resulting transistor structure. It can be seen that the portion of the fin beneath the gate electrode 1010 (corresponding to the channel region) is directly tied to the semiconductor substrate 1001 (resulting in a body-tied structure) and other portions of the fin at the source/drain regions are separated from the surface of the semiconductor substrate by insulation material. Therefore, it is possible to cut off the leakage current path, and thus to greatly reduce the leakage current at the bottom of the channel region.

Though the transistor structure shown in FIG. 18 is described as an example of the invention, it is to be understood by those skilled in the art that various transistor structures may be formed based on the fin structure according to the present invention, for example, double-gate FinFET, triple-gate FinFET and the like, not limited to the structure shown in FIG. 18.

In the above description, details of patterning and etching of the respective layers are not provided. It is to be understood by those skilled in the art that various means in the prior art may be utilized to form the layers and regions in desired shapes. Further, to achieve the same feature, those skilled can devise different methods than those described above.

The present invention is described above with reference to the embodiments thereof. However, those embodiments are provided just for illustrative purpose, rather than limiting the present invention. The scope of the invention is defined by the attached claims as well as equivalents thereof. Those skilled in the art can make various alternations and modifications without departing from the scope of the invention, which all fall into the scope of the invention.

What is claimed is:

1. A method of fabricating a fin transistor structure, comprising:

providing a bulk semiconductor substrate;

patterning the semiconductor substrate to form a fin, with the fin's body directly tied to the semiconductor substrate;

patterning the fin so that gaps are formed on the bottom of the fin at source/drain regions of the transistor structure to be formed, wherein a portion of the fin corresponding to the channel region of the transistor structure to be formed is directly tied to the semiconductor substrate, while other portions of the fin at the source/drain regions are separated from the surface of the semiconductor substrate by the gaps on the bottom of the fin;

filling an insulation material into the gaps; and fabricating the transistor structure based on the semiconductor substrate with the fin formed thereon.

2. The method according to claim 1, wherein the bulk semiconductor substrate comprises Si, Ge, SiC, SiGe, or a group-III-V semiconductor material, or any combination thereof.

3. The method according to claim 2, wherein the group-III-V semiconductor material comprises GaAs, InP, or GaN, or any combination thereof.

4. The method according to claim 1, wherein the insulation material comprises $SiO_2$ or $Si_3N_4$, or a high-k dielectric material, or any combination thereof.

5. The method according to claim 4, wherein the high-k dielectric material comprises $HfO_2$, $ZrO_2$, $Al_2O_3$, $TiO_2$, or $La_2O_3$, or any combination thereof.

6. The method according claim 1, wherein patterning the fin comprises:

forming a first etching protection layer on a surface of the semiconductor substrate and on the top of the fin;

forming a hard mask layer on top of the first etching protection layer;

forming a second etching protection layer on sidewalls of the fin;

patterning the hard mask layer to define the gaps;

etching the fin to form the gaps therein; and removing the hard mask layer, the first etching protection layer, and the second etching protection layer.

7. The method according to claim 6, wherein forming the first etching protection layer on the surface of the semiconductor substrate and on the top of the fin comprises:
- forming a first etching protection layer by deposition, wherein the first etching protection layer is thicker on the surface of the semiconductor substrate and on the top of the fin and is thinner on the sidewalls of the fin; and
- etching the first etching protection layer to remove a portion thereof on the sidewalls of the fin.

8. The method according to claim 6, wherein forming the hard mask layer on the top of the first etching protection layer comprises:
- forming a hard mask layer by deposition, wherein the hard mask layer is thicker on the first etching protection layer and is thinner on the sidewalls of the fin; and
- etching the hard mask layer to remove a portion thereof on the sidewalls of the fin.

9. The method according to claim 6, wherein forming the second etching protection layer on the sidewalls of the fin comprises:
- conformally forming a second etching protection layer by deposition; and
- etching the second etching protection layer to remove a portion thereof on the hard mask, so that the second etching protection layer only exists on the sidewalls of the fin.

10. The method according to claim 6, wherein patterning the hard mask layer comprises:
- selectively etching the hard mask layer to expose a bottom portion of the fin at the source/drain regions of the transistor structure to be formed, while other portions of the fin as well as the surface of the semiconductor substrate are covered by the etching protection layer, the second etching protection layer and/or the hard mask layer.

11. The method according to claim 6, wherein the first etching protection layer and the second etching protection layer comprise $SiO_2$.

12. The method according to claim 6, wherein the hard mask layer comprises $Si_3N_4$.

13. The method according to claim 1, wherein fabricating the transistor structure based on the semiconductor substrate with the fin formed thereon comprises:
- forming a buffer layer on the semiconductor substrate with the fin formed thereon;
- forming a stop layer on the buffer layer;
- forming an isolation layer on the stop layer, and performing planarization on the isolation layer to expose the stop layer above the fin;
- removing a portion of the stop layer to expose the buffer layer above the top of the fin and recess the stop layer on both sides of the fin above the substrate, and removing a portion of the isolation layer to recess the isolation layer above the substrate;
- etching portions of the stop layer and portions of the isolation layer on both sides of the fin above the substrate, so as to expose a top portion of the buffer layer on both sides of the fin above the substrate;
- etching a portion of the exposed buffer layer to further expose a portion of the fin corresponding to the channel region to be formed;
- forming a gate dielectric layer on the exposed portion of the fin; and
- forming a gate electrode that intersects the fin and extends away from both sides of the fin, above the substrate.

* * * * *